United States Patent [19]
Dombrowski

[11] Patent Number: 4,511,859
[45] Date of Patent: Apr. 16, 1985

[54] APPARATUS FOR GENERATING A COMMON OUTPUT SIGNAL AS A FUNCTION OF ANY OF A PLURALITY OF DIVERSE INPUT SIGNALS

[75] Inventor: Leonard C. Dombrowski, Batavia, Ill.

[73] Assignee: AT&T Bell Laboratories, Murray Hill, N.J.

[21] Appl. No.: 412,593

[22] Filed: Aug. 30, 1982

[51] Int. Cl.³ .............................................. H03L 7/22
[52] U.S. Cl. ...................................... 331/11; 331/14; 331/25
[58] Field of Search .................... 331/2, 10, 11, 12, 14, 331/25

[56] References Cited

U.S. PATENT DOCUMENTS

| | | | |
|---|---|---|---|
| 3,518,567 | 6/1970 | Helgesson | 331/2 |
| 3,539,933 | 10/1967 | White | 328/154 |
| 3,546,617 | 12/1970 | Westwood | 331/2 |
| 3,579,128 | 9/1981 | Smith et al. | 328/155 |
| 3,599,111 | 8/1971 | Butler et al. | 331/10 X |
| 3,601,708 | 9/1971 | Stempler et al. | 328/155 |
| 3,660,781 | 9/1972 | Tewksbury et al. | 331/1 A |
| 3,662,277 | 5/1972 | White | 331/2 |
| 3,789,308 | 1/1974 | Lowdenslager | 328/155 |
| 3,812,433 | 9/1974 | Bradley | 328/155 |
| 4,282,493 | 8/1981 | Moreau | 331/2 |
| 4,305,045 | 12/1981 | Metz et al. | 331/1 A |

OTHER PUBLICATIONS

*The Bell System Technical Journal*, vol. 10, No. 6, Jul.-Aug. 1981, R. Metz et al.: "Network Clock Synchronization", pp. 1109–1129.

International Switching Symposium, Montreal, Sep. 21-25, 1981, IEEE, New York (US) C. C. Probert: Synchronization Between DMS Exchanges", Session 42A, Paper 5, pp. 1–6.

International Switching Symposium, Montreal, Sep. 21-25, 1981, IEEE, New York (US), F. Gillet et al.: "An Implementation Strategy for Networks Synchronization of Digital Exchange Networks", Session 41A, paper 8, pp. 1–5.

*Primary Examiner*—Eugene R. LaRoche
*Assistant Examiner*—Robert J. Pascal
*Attorney, Agent, or Firm*—David Volejnicek; Kenneth H. Samples

[57] ABSTRACT

A circuit for generating a common signal as a function of either of two reference signals comprises a pair of phase-locked loops which share an oscillator. Each phase-locked loop generates a control signal as a function of one of the reference signals. One or the other of the control signals is coupled to the oscillator which generates the common signal. A comparator compares the two control signals and generates a signal indicative of their difference. While the control signal generated by the first phase-locked loop is coupled to the oscillator, the difference signal is applied to the second phase-locked loop where it controls the generation of the second control signal to minimize the difference between the two control signals. While the control signal generated by the second phase-locked loop is coupled to the oscillator, the second phase-locked loop is nonresponsive to the difference signal. Thus when a switch of reference signals occurs even if they are of different phase and even if that phase is slowly time-varying, the circuit can lock to the new reference signal at a phase dictated by the phase difference between the two references at the instant of the switch without causing the oscillator output to undergo significant frequency or phase changes.

22 Claims, 2 Drawing Figures

APPARATUS FOR GENERATING A COMMON OUTPUT SIGNAL AS A FUNCTION OF ANY OF A PLURALITY OF DIVERSE INPUT SIGNALS

TECHNICAL FIELD

This invention relates to phase synchronization circuits, and in particular to phase-locked loop circuits.

BACKGROUND OF THE INVENTION

In synchronously operating systems, the source of timing signals is driven by a reference frequency, the source of which is commonly duplicated for reliability purposes. If the reference frequencies are not in phase with each other, upon switchover from the first reference frequency to the second reference frequency as the driving frequency, the timing signals will undergo a phase shift reflective of the difference in phase between the first and the second reference frequency. The timing signals will also undergo a temporary frequency variation as a result of the phase change. Such phase and frequency variations in the timing signals have been found to cause problems in some synchronous systems.

For example, telephone network electronic switching systems are generally redundant, for reliability purposes being comprised of two duplicate halves either one of which can carry on the system tasks in case of failure of the other half. At any one time the output signals generated by only one of the halves of the switching system are utilized as output signals of the switching system as a whole, and serve as inputs to other equipment connected to the switching system. Synchronizing reference signals which are propagated through the two halves of the switching system may be out of phase with each other by the time they arrive at the outputs of the respective halves of the switching system. As a consequence, the output signals of a source of timing signals driven by the synchronizing reference signals often undergo a phase change and a temporary frequency change when the timing signal source is disconnected from the output of the one half and connected to the output of the other half of the switching system. Such phase changes and frequency excursions have been found to cause problems, such as loss of data signals, for communication equipment that is located down-stream from the switching system and that is listening to the system's output signal stream. These problems have led CCITT—International Telegraph and Telephone Consultative Committee—to adopt a standard setting stringent limitations on time interval error, which error includes the changes in phase that the output of a telephone network switching system is allowed to undergo.

One approach of the prior art to solving the phase shift problem has been to adjust the phase of one of the reference frequency sources to equalize it with the phase of the other reference frequency source. However, this approach has not been workable in applications, such as telephony switching systems, where the cause of the phase difference has not been a single, adjustable, reference frequency source, but the cumulative effect of distributed and often unadjustable components.

A second approach taken by the prior art to alleviate the phase shift problem has been to pass one of the reference frequencies through phase delay circuitry to adjust its phase to that of the other reference frequency. With this approach, however, only discrete, highly granular changes could generally be made in the phase of the reference frequency being adjusted, due to the nature of the phase delay elements that are conventionally used for this purpose. Such granularity has often not been sufficient to meet the needs of the application, such as the needs of telephone switching systems striving to meet the stringent CCITT time interval error standards. Refinements of this technique that have sought to achieve fine granularity of phase change, to approach a continuous phase change capability, have generally been very complex and costly, inter alia requiring the use of relatively large numbers of phase delaying elements and associated manipulation circuitry.

SUMMARY OF THE INVENTION

This invention is directed to solving these and other disadvantages of the prior art.

According to this invention, a circuit for generating at least one common signal as a function of a plurality of input signals comprises a generator for generating the at least one common signal in response to any of a plurality of control signals, at least one of which control signals is selectively coupled to the common signal generator, a plurality of generators each for generating at least one of the plurality of control signals in response to at least one of the plurality of input signals, and a controller selectively responsive to at least one of the plurality of control signals for controlling the other control signal generating generators.

The at least one common signal is preferably generated as a function of the difference between the at least one input signal and the at least one common signal. Preferably, the common signal generator and the plurality of control signal generators comprise a plurality of phase-locked loop circuits, which phase-locked loop circuits share an oscillator that generates the common signal.

Advantageously, the controller comprises means for comparing one of the control signals with the other control signals and for generating signals indicative of the differences, and mechanisms selectively responsive to these difference signals for controlling the other control signal generating generators to minimize the difference between the one control signal and the other control signals.

The inventive scheme has many advantages over the schemes of the prior art. It can compensate for phase differences of reference frequencies which differences are caused by distributed or unadjustable effects. It can control the effect that reference frequencies have in a circuit without having to control directly the generators of those reference frequencies. The inventive scheme can effect changes of fine granularity, even continuous changes, in the compensation for phase differences of reference frequencies. Yet it can do so in a simple manner that is relatively inexpensive to implement.

The present invention solves the problem of maintaining an output signal fixed in absolute frequency and phase even though signals used as alternative references therefor are not in phase synchronism. The features of this invention make it suitable for telephony applications. In particular, telephone network switching systems are enabled through use of the invention to avoid phase and frequency excursion problems of their outputs upon switchover of operations from one half of the duplicated system to the other half. Thus the switching systems are enabled with the aid of the present invention to meet the CCITT time interval error standards.

These and other advantages of the present invention will become more apparent during the following description of an illustrative embodiment of the invention considered together with the drawing.

DETAILED DESCRIPTION

Figure 1:
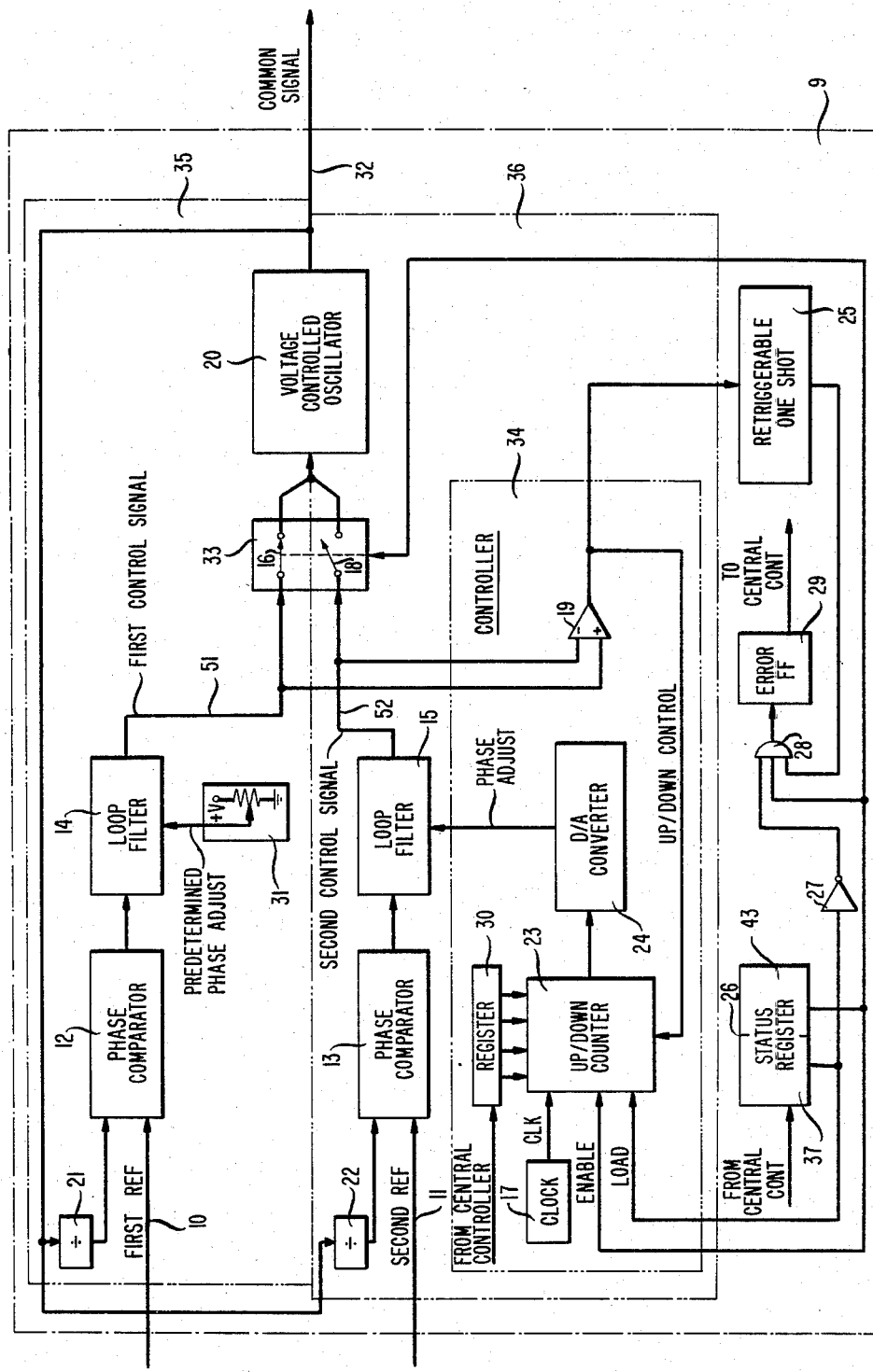
FIG. 1 is a block diagram of a circuit embodying a first illustrative example of the invention.

Referring now to FIG. 1, there is shown a circuit 9, such as may advantageously be used in each half of a telephone network switching system, which embodies an illustrative example of the present invention. The circuit 9 includes two input leads 10 and 11 and an output lead 32. The lead 10 supplies the circuit 9 with a first reference signal while the lead 11 supplies the circuit 9 with a second reference signal. The circuit 9 outputs on the lead 32 a signal which it generates as a function of either of the two reference signals received over the input leads 10 and 11. Thus the output signal appearing on the lead 32 is a signal common to both input reference signals.

The circuit 9 is substantially comprised of a pair of phase-locked loops 35, 36, and of switching and monitoring circuitry. The first phase-locked loop 35 includes a phase comparator 12, a loop filter 14 with a controller 31, a voltage-controlled oscillator 20, and a frequency divider 21. The second phase-locked loop includes a phase comparator 13, a loop filter 15 with a controller 34, the oscillator 20, and a frequency divider 22. Thus the two phase-locked loops 35, 36 share the oscillator 20.

Each of the phase-locked loops 35, 36 generates a control signal as a function of one of the two reference signals supplied over the input leads 10 and 11. The two reference signals are time varying signals, and each has a predetermined frequency. The first control signal, generated by the loop 35, appears on a lead 51. The second control signal generated by the loop 36, appears on a lead 52. The control signal generated by one or the other of the phase-locked loops 35 or 36 is selectively connected to an input of the oscillator 20 by a switching complex 33. The oscillator 20 generates the common signal under control of the control signal which is connected to its input and places the common signal onto the output lead 32.

The common signal appearing on the lead 32 is also a time varying signal and generally has a relatively high frequency with respect to the two reference signals appearing on the leads 10 and 11. The common signal is therefore input to the frequency divider 21, which is a conventional device that converts the common signal into a signal corresponding in frequency to the first reference signal appearing on the input lead 10. The converted signal that is generated by the frequency divider 21 is connected to one input of the phase comparator 12, whose second input is connected to the lead 10.

The phase comparator 12 is a conventional device. It compares the phases of the two signals appearing at its inputs and generates a signal whose voltage level is proportional to the difference in their phases. The comparator 12 sends this phase difference indicative signal to an input of the loop filter 14.

The loop filter 14 is again a conventional device. It compares the voltage level of the phase difference indicative signal received from the comparator 12 with the voltage level of a signal appearing at its control input, and generates a first control signal whose voltage level is indicative of the difference in voltage. The first control signal appears at the output of the loop filter 14 on the lead 51 and is selectively connected to a control input of the oscillator 20 by a switch 16 of the switching complex 33. When connected to the oscillator 20, the first control signal regulates the phase and frequency of the common signal which appears on the lead 32.

The signal appearing at the control input of the loop filter 14 is generated by the controller 31. In this example, the controller 31 is a rheostat whose sliding contact is connected to the control input of the loop filter 14. One of the remaining two contacts of the rheostat is connected to a voltage source $+V$ while the other of the two contacts is connected to ground.

Adjustment of the controller 31 controls the output of the loop filter 14 and hence affects the common signal output of the oscillator 20. The setting of the controller 31 is manually adjusted to produce some predetermined phase difference between the first reference signal appearing on the input lead 10 and the common signal appearing on the lead 32. Advantageously for this illustrative embodiment, the setting of the controller 31 is made such as to effect a 90 degree phase difference between the first reference signal and the common signals.

The first phase-locked loop 35 thus serves as a negative feedback circuit to bring the common signal output of the oscillator 20 into frequency synchronism with the first reference signal, with a constant phase difference predetermined by the setting of the controller 31.

In the present example, the second reference signal, appearing on the input lead 11, is in frequency synchronism with the first reference signal, but is of a frequency different from that of the first reference signal appearing on the input lead 10. Hence the common signal output by the oscillator 20 is also input to the frequency divider 22, which converts the common signal into a signal corresponding in frequency to the second reference signal. The frequency divider 22 is again a conventional device. The converted signal that is output by the divider 22 is connected to one input of the phase comparator 13, whose second input is connected to the lead 11.

If the two reference signals appearing on the leads 10 and 11 were of the same frequency, the frequency divider 22 could be omitted and the output of the frequency divider 21 could be connected to the inputs of both phase comparators 12 and 13.

The above-mentioned phase comparator 13 is likewise a conventional device. It compares the phases of the two signals appearing at its inputs and generates a signal whose voltage level is proportional to the difference in the phases of the two signals appearing at its inputs. The comparator 13 sends this phase difference indicative signal to an input of the loop filter 15.

Again a conventional device, the loop filter 15 compares the voltage level of the phase difference indicative signal with the voltage level of a signal appearing at its control input and generates a second control signal whose voltage level is indicative of the difference in voltage. The second control signal appears at the output of the loop filter 15 on the lead 52 and is selectively connected to the control input of the oscillator 20 by a switch 18 of the switching complex 33. When connected to the oscillator 20, the second control signal regulates the phase and frequency of the common signal which appears on the lead 32. Only the one switch 16 or the other switch 18 is closed at any one time and hence only the first or the second control signal regulates the common signal at any one time.

The signal appearing at the control input of the loop filter 15 is generated by the controller 34. The controller 34 regulates the loop filter 15 to bring the voltage level of the second control signal appearing on the lead 52 substantially to the voltage level of the first control signal appearing on the lead 51. The controller 34 includes a comparator 19, an up/down counter 23, and a digital-to-analog (D/A) converter 24. The positive input of the comparator 19 is connected to the output of the loop filter 14 while the negative input of the comparator 19 is connected to the output of the loop filter 15. The comparator 19 compares the voltage levels of the first and second control signals produced by the loop filters 14 and 15, respectively, and produces a digital signal which is a logical "one" when the first control signal, appearing on the lead 51, is greater than the second control signal, appearing on the lead 52 and is a logical "zero" when the second control signal is greater than the first control signal. Thus the signal output by the comparator 19 is representative of the relative difference in levels of the first and the second control signals. This voltage difference signal is coupled to an up/down control input of the up/down counter 23.

The up/down counter 23 is a conventional digital counter. It has a source 17 of clock signals connected to its clock (CLK) input. A register 30 whose bits are connected in parallel to a parallel load input port of the counter 23 holds an initial value for the counter 23. Additionally, the counter 23 has ENABLE and LOAD inputs, and an output port which is connected to an input port of the D/A converter 24.

When the ENABLE input of the counter 23 is not asserted and the LOAD input is asserted, the counter 23 is parallel-loaded with the value stored in the register 30. The register 30 is programmable. It is loaded with the initial value by a central controller (not shown) in a conventional manner. Advantageously, the register 30 contains a value that will produce a voltage level at the control input of the loop filter 15 that is substantially the same as the voltage level produced by the controller 31 at the control input of the loop filter 14.

When the ENABLE input of the counter 23 is asserted and the LOAD input is not asserted, the counter 23 increments or decrements its count by one upon the receipt of each clock pulse at its CLK input. The direction of counting is determined by the state of the up/down control input. When a logical "one" signal appears at the up/down control input, the counter 23 counts up; when a logical "zero" signal appears at the up/down control input, the counter 23 counts down.

When neither the ENABLE nor the LOAD input is asserted, the counter 23 maintains the count it reached at the time of deassertion of the ENABLE input and thus locks its output to an unchanging value.

The digital count of the counter 23 appears at its output port, and is channeled therefrom to an input of the D/A converter 24. The D/A converter 24 converts the count into a corresponding analog voltage level, which appears at the output of the D/A converter 24 and is channeled therefrom to the control input of the loop filter 15.

The effect of the controller 34 while the counter 23 is enabled is to control the loop filter 15 such that the second control signal produced thereby and appearing on the lead 52 tends to become equal to the first control signal produced by the loop filter 14 and appearing on the lead 51. Thus, although the phase comparator 13 and the loop filter 15 are not influencing the oscillator 20 while the switch 18 is open, the output of the controller 34 to the loop filter 15 is being adjusted so a closure of switch 18 (with a corresponding opening of switch 16) would not cause any significant phase change to the input of phase comparator 13. That is, the reference source for oscillator 20 could be switched from the first reference on the line 10 to the second reference on the line 11 by a closure of switch 18 and a corresponding opening of switch 16 with substantially no phase shift occurring on the common signal on the line 32 even when the first and second references are of different phase.

The ENABLE and LOAD inputs of the up/down counter 23 are connected to the outputs of a status register 26. The status register 26 in this example is comprised of a first and a second flip-flop 37 and 43, respectively. The flip-flops 37 and 43 are set and reset by the central controller (not shown) in a conventional manner. The output of the flip-flop 37 controls the LOAD input of the counter 23 and the output of the flip-flop 43 controls the ENABLE input.

The output of the flip-flop 43 is also connected to a control input of the switching complex 33 which is comprised of the switches 16 and 18. The switches 16 and 18 are complementary, in that one of them is open while the other is closed. The control input of the switching complex 33 regulates the opening and closing of the switches 16 and 18. When the control input is asserted, the switch 16 is closed and the switch 18 is open; when the control input is not asserted, the switch 16 is open and the switch 18 is closed.

Optionally, it may be desirable to monitor the operation of the controller 34. For this purpose, the output of the comparator 19 is also connected to an input of a retriggerable one shot 25. A conventional unit, the retriggerable one shot 25 sets its output low for a predetermined period of time when a signal level transition appears at its input.

The output of the retriggerable one shot is connected to an input of an AND gate 28. A second input of the gate 28 is connected to the output of the flip-flop 43, and a third input is connected via an inverter 27 to the output of the flip-flop 37. Thus the input from the one shot 25 appears at the output of the AND gate 28 only when the up/down counter 23 is not being loaded and is enabled to operate.

The output of the gate 28 is connected to the input of a flip-flop 29 whose state indicates occurrence or non-occurrence of error in operation of the control 34 while the counter 23 is enabled. The state of the error flip-flop 29 is monitored by the central controller (not shown) in a conventional manner.

The one shot 25 generally maintains a high output level, which is changed to a low output level for a predetermined period of time by the appearance of a signal level transition at the input of the one shot 25. When the output of the comparator 19 does not undergo a signal level transition at least once within every predetermined period of time the one shot 25 sets its output to a high level. If this occurs while the counter 23 is enabled, and not loading, the gate 28 allows this high level to pass through to the flip-flop 29, and the flip-flop 29 is set to indicate an error in the operation of the controller 34.

The operation of the circuit 9 of FIG. 1 is as follows. Initially, the central controller (not shown) causes the flip-flop 31 to assert the LOAD input of the up/down counter 23 to load the counter 23 with the contents of the register 30. The central controller then causes the flip-flop 37 to deassert the LOAD input, and causes the flip-flop 43 to assert the ENABLE input of the counter 23 to activate the counter 23. Additionally, the AND gate 28 becomes responsive to the output of the one shot 25. The output of the flip-flop 43 also causes the switch 16 to close and the switch 18 to open.

Upon the closing of the switch 16 the oscillator 20 is made an active part of the phase-locked loop 35 and its common signal output becomes frequency synchronized and delayed by a constant phase difference with the first reference signal appearing on the input lead 10. The phases of the first reference signal and of the common signal assume the predetermined phase difference dictated by the setting of the controller 31. This occurs in response to the first control signal being output by the loop filter 14. The voltage level of the first control signal changes to bring about the predetermined phase relationship dictated by output of the controller 31. The first control signal then assumes a constant level to maintain this phase relationship. Thereafter the first control signal changes level only in response to a shift in the first reference signal, which shift requires a corresponding shift in the common signal output of the oscillator 20 to maintain the predetermined phase relationship.

The same phase relationship is initially set by the controller 34 between the second reference signal and the common signal as a consequence of the contents of the register 30 and hence the initial contents of the counter 23.

Assuming that there is a difference in phase between the first and second reference signals, the phase relationship of the second reference signal and the common signal will not correspond to the phase relationship initially indicated by the controller 34, and hence the level of the second control signal, output by the loop filter 15, will differ from the level of the first control signal as the loop filter 15 attempts to change the phase of the common signal output of the oscillator 20. But because the switch 18 is open, the second control signal cannot reach the oscillator 20 and hence has no affect on the oscillator 20.

However, the difference in the levels of the first and second control signals is sensed by the comparator 19, which outputs a signal indicative of this level difference. If the phase of the first reference signal leads the phase of the second reference signal, the voltage level of the first control reference signal is higher than the voltage level of the second control signal which is trying to retard the phase of the common signal, and hence the output voltage of the comparator 19 is a logical "one". If the phase of the first reference signal lags the phase of the second reference signal, the voltage level of the first control signal is lower than the voltage level of the second control signal which is trying to advance the phase of the common signal, and hence the output voltage level of the comparator 19 is a logical "zero". If the two reference signals are in phase, the voltage levels of the first and second control signals are the same, and the output signal of the comparator 19 steps alternately between logical "one" and "zero".

Upon reaching the up/down control input of the up/down counter 23, the output voltage level of the comparator 19 causes the counter 23 to change its count. If the output of the comparator 19 is a logical "zero", the up/down counter 23 responds to clock pulses from the clock 17 by decreasing its count. If the output of the comparator 19 is a logical "one", the counter 23 counts up. In either case, the counter 23 counts up or down depending on the logical state at the up/down control input. The counter 23 reverses the direction of its count when the signal at the up/down control input reverses its level.

The D/A converter 24 converts the count generated by the up/down counter 23 into a proportional voltage level and therewith controls the loop filter 15 to bring the voltage level of the second control signal output by the filter 15, into correspondence with the voltage level of the first control signal. If the voltage level of the first control signal exceeds the voltage level of the second control signal, the voltage level output of the D/A converter 24 rises to cause an increase in the voltage level of the second control signal. Conversely, if the voltage level of the second control signal exceeds the voltage level of the first signal, the voltage level output of the D/A converter 24 falls to cause a decrease in the voltage level of the second control signal. If the voltage levels of the two control signals are nearly the same, the voltage level output of the D/A converter steps up and down with each succeeding clock pulse into the up/down counter 23 causing the second control signal to oscillate about the level of the first control signal.

As the phase relationship of the first and the second reference signals changes, the level of the output signal of the controller 34 changes accordingly to maintain the levels of the first and second control signals substantially equal.

Because the output of the comparator 19 and of the counter 23 is digital and therefore changes in fixed quantities, some granularity will exist in the output of the D/A converter 24 and commonly the level of the second signal will not come to exactly equal the level of the first control signal, but will overshoot it. The overshoot causes the output of the comparator 19 to reverse the logic level of its output and consequently causes the direction of count of the counter 23 to become reversed. This process is continued indefinitely. Thus the level of the second control signal initially converges toward the level of the first control signal and thereafter oscillates about the level of the first signal, with the excursions being of a granularity that is determined by the frequency of the clock 17 and the amount of response of the output of the D/A converter 24 to a single count change in the output of the up/down counter 23.

The transitions of the output level of the comparator 19 are sensed by the retriggerable one shot 25, which responds to either positive or negative transitions by setting its output low for a predetermined period. If the output of the one shot 25 is still low when the next transition in the output of the comparator 19 is sensed, the output of the one shot 25 remains low and the running of the predetermined period is merely reset. The one shot 25 is adjusted such that during normal operation of the circuit 9, with the ENABLE input of the counter 23 asserted, the output level of the comparator 19 undergoes a sensed transition at least once during each duration of each predetermined period.

If a sensed transition of the output level of the comparator 19 does not occur during each period, the one shot 25 brings its output high. This causes a change in the output level of the AND gate 28 from low to high, causing the error flip-flop 29 to become set and thus to indicate an occurrence of an error.

To switch control of the oscillator 20 from the phase-locked loop 35 to the phase-locked loop 36, and thereby to begin generating the common signal as a function of the second reference signal and to cease generating it as a function of the first reference signal, the central controller causes the flip-flop 43 to cease to assert high its output. This opens the switch 16 while simultaneously closing the switch 18. The oscillator 20 thus comes under the control of the second control signal, appearing on the lead 52, but since the level of the second control signal has been adjusted to be substantially equal to the level of the first control signal, appearing on the lead 51, the output of the oscillator 20 undergoes substantially no change.

The counter 23 becomes disabled when the flip-flop 43 ceases to assert high the ENABLE input. The counter 23 thus ceases to respond to its up/down control and CLK inputs. Rather, the counter 23 locks onto its count at the moment of disablement, and continues to output this count. Thus the level of the second control signal ceases to be adjusted to approximate the level of the first control signal, and changes only in response to changes in the output of the phase comparator 13 to cause the common signal to maintain the phase relationship with the second reference signal which is dictated by the constant output of the controller 34.

The FIG. 1 embodiment of the invention just described allows the second control signal output of the second phase locked loop 36 to track the first control signal output of the first phase locked loop 35, but does not provide a direct capability for the first control signal of the first loop 35 to track the second control signal of the second loop 36. Hence, it does not provide a direct capability of switching control of the oscillator 20 from the second to the first control signal without substantially affecting the phase and frequency of the common signal output of the oscillator 20. A second embodiment of the invention which does provide this additional capability is described next.

Figure 2:
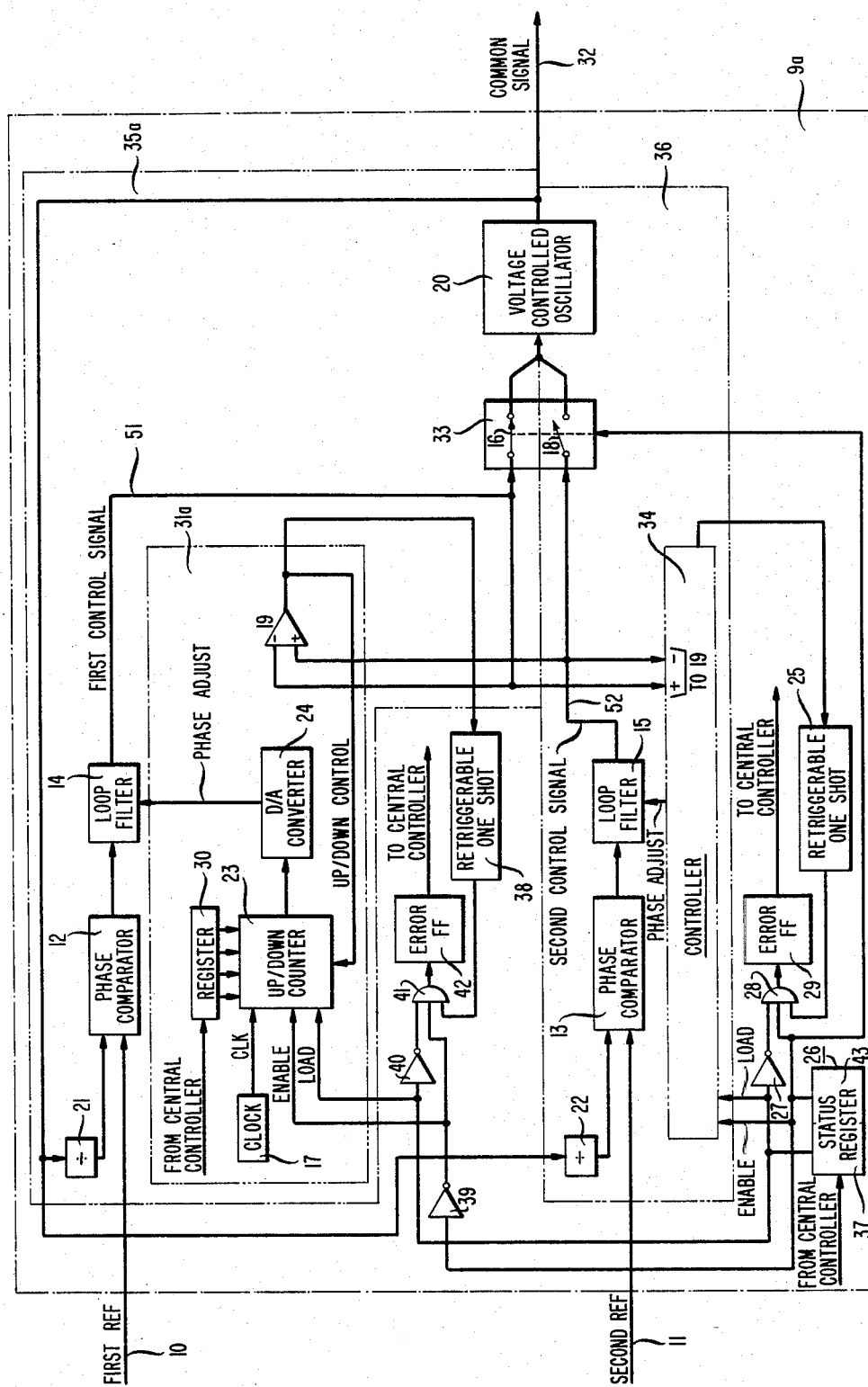
FIG. 2 is a block diagram of a circuit embodying a second illustrative example of the invention.

Turning now to FIG. 2, there is shown a second circuit 9a showing the second embodiment of the invention. The circuit 9a is substantially the circuit 9 wherein the rheostat controller 31 of the phase locked loop 35 has been replaced with a controller akin to the controller 34 of the phase locked loop 36. Such modification gives the circuit 9a improved versatility over the circuit 9, for it allows a switch of control of the oscillator 20 from the second reference signal back to the first reference signal without substantially affecting thereby the frequency and phase of the common signal.

As the circuit 9a is substantially a modification of the circuit 9, the same numbers have been used in both FIGS. 1 and 2 to identify components common to both circuits 9a and 9, and only the differences in the circuits 9a and 9 will be discussed. Likewise, the circuit 9a operates in a manner similar to that of the circuit 9, and therefore only the differences in their operation will be discussed.

The circuit 9a is comprised of a pair of phase locked loops 35a and 36 which share the oscillator 20. The loop 36 of the circuit 9a is the same as the loop 36 of the circuit 9. The loop 35a of the circuit 9a is the loop 35 of the circuit 9 with the rheostat controller 31 having been replaced with a controller 21a which is substantially duplicative of the controller 34. To provide negative feedback to the loop 35a, the inputs of the comparator 19 of the controller 31a have been reversed with respect to the inputs of the comparator 19 of the controller 31. Thus, in the controller 31a the first control signal, appearing at the output of the loop filter 14, is connected to the negative input of the comparator 19, while the second control signal, appearing at the output of the loop filter 15, is connected to the positive input of the comparator 19. The LOAD input of the up/down counter 23 of the controller 31a is connected to the output of the flip-flop 43, while the ENABLE input of the up/down counter 23 of the controller 32a is connected to the output of the flip-flop 37 across an inverter 39.

During operation of the circuit 9a of FIG. 2, the inverter 39 assures that the up/down counter 23 of the controller 31a is enabled while the up/down counter 23 of the controller 34 is disabled, and vice versa.

For purposes of monitoring the operation of the controller 31a, the output of its comparator 19 is also connected to an input of a retriggerable one shot 38. The one shot 38 operates the same as the one shot 25. The output of the retriggerable one shot 38 is connected to an input of an AND gate 41. A second input of the gate 41 is connected via the inverter 39 to the output of the flip-flop 43, and a third input is connected via an inverter 40 to the output of the flip-flop 37. The monitoring circuitry comprised of the elements 38–42 provides the same function for the controller 31a as the monitoring circuitry comprised of the elements 25 and 27–29 provides for the controller 34.

The operation of the circuit 9a of FIG. 2 is as follows. Initially, the central controller (not shown) causes the flip-flop 31 to assert the LOAD input of the up/down counters 23 of both controllers 31 and 34 to load the counters 23 with the contents of their respective registers 30. In the present example, both registers 30 contain the same value. The central controller then causes the flip-flop 31 to deassert the LOAD input, and causes the flip-flop 43 to assert the ENABLE input of the counter 23 of the controller 34 to activate that controller 34. At the same time the inverter 39 causes the flip-flop 43 to deassert the ENABLE input of the counter 23 of the controller 31a to deactivate the controller 31a. The output of the flip-flop 43 also allows the output of the one shot 25 to pass through the gate 28 and thus enables the monitoring of the controller 34 while blocking the output of the one shot 38 at the gate 41 and thus disabling the monitoring of the controller 31a. The output of the flip-flop 43 further closes the switch 16 and opens the switch 18, placing the oscillator 20 under the control of the first control signal being generated by the loop filter 14 and appearing on the lead 51.

With its up/down counter 23 disabled the controller 31a is nonresponsive to the difference in level between the first and second control signals. Rather, the counter 23 of the controller 31a maintains the count with which it was loaded from its associated register 30, and in response the D/A converter 24 of the controller 31a transmits to the control input of the loop filter 14 a constant voltage level which is proportional to this count. Thus from the viewpoint of the loop 35a the controller 31a is functioning in the manner of the controller 31 of FIG. 1.

The loop 36 of the circuit 9a is functioning the manner of the loop 36 of the circuit 9, adjusting the voltage level of the second control signal to the voltage level of the first control signal.

As was described for the circuit 9 of FIG. 1, upon change of state of the flip-flop 43, the up/down counter 23 of the controller 34 becomes disabled, the gate 28 blocks the output of the one shot 25, and the state of the switching complex 33 reverses to bring the oscillator 20 under control of the second control signal produced by the loop filter 15 and appearing on the lead 52.

At the same time, however, the up/down counter 23 of the controller 31a becomes enabled and the gate 41 enables the error flip-flop 42 to respond to the output of the one shot 38. The controller 31a thus assumes the mode of operation that was previously engaged in by the controller 34. Namely, the controller 31a now monitors the difference in levels of the first and second control signals and transmits signals to the control input of the loop filter 14 to bring and maintain the voltage level of the first control signal substantially at the voltage level of the second control signal.

Upon another change of state of the flip-flop 43, the operation of the circuit 9a reverts to the operation that was initially described, with the controller 34 enabled, the controller 31a disabled, and the oscillator 20 under control of the first control signal. Because the controller 31a caused the voltage level of the first control signal to reach the voltage level of the second control signal while the oscillator 20 was under control of the second control signal, the output of the oscillator 20 undergoes substantially no change upon the oscillator 20 being placed again under control of the first control signal.

The switch of control of the oscillator 20 from the first control signal to the second control signal and back again can thus be performed repeatedly without substantially affecting the phase and frequency of the common signal output of the oscillator 20, despite variations in the phase relationship of the first and second reference signals.

Of course, it should be understood that various changes and modifications to the illustrative embodiment described above will be apparent to those skilled in the art. For example, the controllers 34 and 31a may be implemented as analog circuits. Or other phase-locked loops of the type of the loop 36 and sharing the oscillator 20 may be added to the circuit 19 to allow the common signal to be selectively generated as a function of additional reference signals. These and other changes and modifications can be made without departing from the spirit and the scope of the invention and without diminishing its attendant advantages. It is therefore intended that all such changes and modifications be covered by the following claims.

What is claimed is:

1. A circuit for generating at least one common signal as a function of any of a plurality of input signals, comprising:

first means for supplying said plurality of input signals;

second means for generating said at least one common signal in response to at least one of a plurality of control signals;

plurality of third means each for controllably generating at least one of said plurality of control signals as a function of the difference between at least one of said plurality of input signals and said at least one common signal;

fourth means for selectively coupling at least one of said plurality of said control signals to said second means; and fifth means selectively responsive to at least one of said plurality of control signals for controlling generation by the third means of at least the control signals other than said at least one control signal to which said fifth means are responsive.

2. The circuit of claim 1 wherein said plurality of input signals and said at least one common signal are time varying signals and wherein each of said third means comprise means for controllably generating said at least one control signal as a function of the phase difference between said at least one of said plurality of input signals and said at least one common signal.

3. The circuit of claim 1 wherein said fifth means comprise means for controlling generation by the third means of at least the control signals other than said at least one control signal to which said fifth means are responsive, to minimize the difference between said at least one control signal to which said fifth means are responsive and said other control signals.

4. A circuit for generating at least one common signal as a function of any of a plurality of input signals, comprising:

first means for supplying said plurality of input signals;

second means for generating said at least one common signal in response to at least one of a plurality of control signals;

plurality of third means each for controllably generating at least one of said plurality of control signals in response to at least one of said plurality of input signals;

fourth means for selectively coupling at least one of said plurality of control signals to said second means; and fifth means selectively responsive to at least one control signal of said at least one control signal coupled to said second means for controlling generation by the third means of at least the control signals other than said at least one control signal to which said fifth means are responsive.

5. The circuit of claim 4 wherein said fifth means comprise:

means for comparing said at least one control signal to which said fifth means are responsive with said other control signals and for generating at least one difference signal indicative of their difference; and means selectively responsive to said at least one difference signal for controlling generation by the third means of at least said other control signals to minimize the difference between said at least one control signal to which said fifth means are responsive and said other control signals.

6. A circuit for generating a common signal as a function of any of a plurality of input signals, comprising:

first means for supplying said plurality of input signals;

second means for generating said common signal in response to one of plurality of control signals;

plurality of third means each for controllably generating one of said plurality of control signals in response to one of said plurality of input signals;

fourth means for selectively coupling one of said plurality of control signals to said second means; and fifth means selectively responsive to said one control signal coupled to said second means for controlling generation by the third means of the control signals other than said one control signal coupled to said second means.

7. The circuit of claim 6 wherein each of said third means comprise means for generating said control signal as a function of the difference between said one of said plurality of input signals and said common signal.

8. The circuit of claim 6 wherein said plurality of input signals and said common signal are time varying signals and wherein each of said third means comprise means for controllably generating said one of said plurality of control signals as a function of the phase difference between said one of said plurality of input signals and said common signal.

9. The circuit of claim 6 wherein said fifth means comprise means for controlling generation by the third means of said other control signals to minimize the difference between said one control signal coupled to said second means and said other control signals.

10. The circuit of claim 6 wherein said fifth means comprise:
at least one sixth means for comparing said one control signal coupled to said second means with one of said other control signals and for generating a difference signal indicative of their difference; and
at least one seventh means each associated with one of said at least one sixth means and selectively responsive to said difference signal for controlling generation by the third means of said one of said other control signals to minimize the difference between said one control signal coupled to said second means and said one of said other control signals.

11. The circuit of claim 10 further comprising eighth means for making said seventh means nonresponsive to said difference signal while said fourth means couple said one of said other control signals to said second means.

12. A circuit for generating a common signal as a function of any of a plurality of input signals, comprising:
means for supplying a first and a second input signal;
means for generating said common signal in response to one of a first and a second control signal;
first means for generating said first control signal in response to said first input signal;
second means for controllably generating said second control signal in response to said second input signal;
means for selectively coupling one of said first and said second control signals to said common signal generating means; and
control means selectively responsive to said first control signal for controlling generation of said second control signal by said second means to minimize the difference between said first and second control signals.

13. The circuit of claim 12 wherein said first means controllably generate said first control signal, the circuit further comprising:
control means selectively responsive to said first control signal for controlling generation of said second control signal by said first means to minimize the difference between said first and second control signals.

14. The circuit of claim 12 wherein
said first means comprise means for generating said first control signal as a function of the difference between said common signal and said first input signal, and wherein
said second means comprise means for controllably generating said second control signal as a function of the difference between said common signal and said second input signal.

15. The circuit of claim 12 wherein
said input signals are time varying signals; wherein
said first means comprise means for generating said first control signal as a function of the phase difference between said common signal and said first input signal; and wherein
said second means comprise means for controllably generating said second control signal as a function of the phase difference between said common signal and said second input signal.

16. The circuit of claim 12 wherein said control means comprise:
third means for comparing said first control signal with said second control signal and for generating a difference signal indicative of their difference; and
fourth means selectively responsive to said difference signal for controlling generation of said second control signal by said second means to minimize the difference between said first and said second control signals.

17. The circuit of claim 16 further comprising means for making said fourth means responsive to said difference signal only while said selective coupling means couple said first control signal to said common signal generating means.

18. The circuit of claim 12 further comprising means for making said control means responsive to said first control signal while said selective coupling means couple said first control signal to said common signal generating means.

19. The circuit of claim 12 wherein said means for generating said common signal comprise a voltage controlled oscillator and wherein each of said first and second control signals comprises a voltage level signal.

20. A circuit for generating a common signal as a function of any of a plurality of reference signals, comprising:
means for supplying a first and a second reference signal;
an oscillator for generating said common signal in response to one of a first and a second control signals;
first means for generating said first control signal in response to said first reference signal;
second means for generating said second control signal in response to said second reference signal;
means for selectively coupling said first and said second control signals to said oscillator;
means for comparing said first control signal with said second control signal and for generating a difference signal indicative of their difference; and
means selectively responsive to said difference signal for controlling said second means to minimize the difference between said first and said second control signals.

21. A circuit for generating a common signal as a function of any of a plurality of reference signals, comprising:
- means for supplying a first and a second reference signals;
- a first and a second phase-locked loop circuit sharing an oscillator for generating said common signal in response to one of a first and a second control signals, said first phase-locked loop circuit further having a first portion for generating said first control signal in response to said first reference signal and said common signal, and said second phase-locked loop circuit further having a second portion for generating said second control signal in response to said second reference signal and said common signal;
- switching means for selectively coupling said first and said second control signals to said oscillator;
- means for comparing said first and said second control signals and for generating a difference signal indicative of their difference; and
- means selectively responsive to said difference signal for controlling said second portion to minimize said difference between said first and said second control signals.

22. A circuit for generating a common signal as a function of any of a plurality of reference signals, comprising:
- means for supplying a first and a second reference signals;
- an oscillator for generating said common signal, said oscillator responsive to a selected one of a first and second control signals to adjust said phase difference between said first reference signal and said common signal to a first predetermined value;
- means for generating a third signal representative of the phase difference between said first reference signal and said common signal,
- means responsive to said third signal for generating said first control signal;
- means for generating a fourth signal representative of the phase difference between said second reference signal and said common signal;
- means responsive to said fourth signal for generating said second control signal;
- switching means for selectively connecting said oscillator to one of said first and said second control signals;
- means for comparing said first control signal with said second control signal and for generating a fifth signal indicative of their difference;
- control means responsive to said fifth signal for selectively controlling said second control signal generating means to minimize the difference between said first and said second control signals; and
- means for disabling said control means from changing their state while said switching means connect said second control signal to said oscillator.

* * * * *